United States Patent
Bae et al.

(10) Patent No.: US 11,662,388 B2
(45) Date of Patent: May 30, 2023

(54) APPARATUS FOR ESTIMATING A BATTERY FREE CAPACITY

(71) Applicant: LG CHEM, LTD., Seoul (KR)

(72) Inventors: Yoon-Jung Bae, Daejeon (KR); Dae-Soo Kim, Daejeon (KR); Ji-Yeon Kim, Daejeon (KR); Dong-Kyu Kim, Daejeon (KR); Jae-Hyun Lee, Daejeon (KR); Jin-Hyung Lim, Daejeon (KR); Young-Geun Choi, Daejeon (KR)

(73) Assignee: LG Energy Solution, Ltd., Seoul (KR)

( * ) Notice: Subject to any disclaimer, the term of this patent is extended or adjusted under 35 U.S.C. 154(b) by 894 days.

(21) Appl. No.: 16/606,359

(22) PCT Filed: Oct. 31, 2018

(86) PCT No.: PCT/KR2018/013137
§ 371 (c)(1),
(2) Date: Oct. 18, 2019

(87) PCT Pub. No.: WO2019/098576
PCT Pub. Date: May 23, 2019

(65) Prior Publication Data

US 2022/0381841 A1    Dec. 1, 2022
US 2022/0381841 A1    Dec. 1, 2022

(30) Foreign Application Priority Data

Nov. 16, 2017   (KR) .................. 10-2017-0153126

(51) Int. Cl.
*G01R 31/3835* (2019.01)
*G01R 31/396* (2019.01)
(Continued)

(52) U.S. Cl.
CPC ..... *G01R 31/3835* (2019.01); *G01R 31/3648* (2013.01); *G01R 31/388* (2019.01); *G01R 31/396* (2019.01)

(58) Field of Classification Search
CPC ................. G01R 31/396; G01R 31/3835
(Continued)

(56) References Cited

U.S. PATENT DOCUMENTS 9,207,287 B2   12/2015   Joe et al.
9,714,982 B2   7/2017   Tsuzuku et al.
(Continued)

FOREIGN PATENT DOCUMENTS

CN    1437031 A    8/2003
CN    102645636 A    8/2012
(Continued)

OTHER PUBLICATIONS

Office Action dated Jul. 20, 2020, issued in corresponding Korean Patent Application No. 10-2017-0153126.
(Continued)

*Primary Examiner* — Ricky Go
(74) *Attorney, Agent, or Firm* — Morgan, Lewis & Bockius LLP

(57) ABSTRACT

The present disclosure relates to an apparatus for estimating a battery free capacity, and more particularly, an apparatus for estimating a free capacity of a half cell of a battery. According to the present disclosure, it is possible to accurately estimate a free capacity of a half cell without inserting a reference electrode by revising an entire SOC region of a half cell by using an inflection point detected based on SOC-voltage data of a full cell and a half cell of the battery, respectively, and then estimating SOC-voltage data based on a SOC difference between the entire SOC regions before and after the revision.

15 Claims, 6 Drawing Sheets

(51) Int. Cl.
*G01R 31/388* (2019.01)
*G01R 31/36* (2020.01)
(58) Field of Classification Search
USPC .......................................................... 702/63
See application file for complete search history.

(56) References Cited

U.S. PATENT DOCUMENTS

| | | | |
|---|---|---|---|
| 2003/0112011 A1 | 6/2003 | Guiheen et al. | |
| 2003/0171881 A1* | 9/2003 | Park | G01R 31/367 |
| | | | 702/63 |
| 2006/0022676 A1 | 2/2006 | Uesaka et al. | |
| 2012/0176092 A1 | 7/2012 | Fujii et al. | |
| 2013/0314050 A1 | 11/2013 | Matsubara et al. | |
| 2013/0338950 A1 | 12/2013 | Joe et al. | |
| 2015/0066406 A1 | 3/2015 | Sun et al. | |
| 2015/0086812 A1 | 3/2015 | Joe et al. | |
| 2015/0137822 A1* | 5/2015 | Joe | H01M 4/364 |
| | | | 324/426 |
| 2015/0285866 A1 | 10/2015 | Frost et al. | |
| 2016/0061908 A1 | 3/2016 | Torai et al. | |
| 2017/0033572 A1* | 2/2017 | Becker | H02J 7/0024 |
| 2017/0146610 A1 | 5/2017 | Cha et al. | |
| 2017/0212203 A1* | 7/2017 | Young | H01M 10/345 |

FOREIGN PATENT DOCUMENTS

| | | |
|---|---|---|
| EP | 2848953 A | 3/2015 |
| JP | 2007-024740 A | 2/2007 |
| JP | 2012-145403 A | 8/2012 |
| JP | 2013-089423 A | 5/2013 |
| JP | 2013-247003 A | 12/2013 |
| JP | 5741348 B2 | 7/2015 |
| KR | 10-2005-0074531 A | 7/2005 |
| KR | 10-0874727 B1 | 12/2008 |
| KR | 10-2013-0139758 A | 12/2013 |
| KR | 10-2016-0048585 A | 5/2016 |
| KR | 10-2017-0045730 A | 4/2017 |

OTHER PUBLICATIONS

International Search Report issued in corresponding International Patent Application No. PCT/KR2018/013137, dated Feb. 12, 2019.
Office Action dated Apr. 25, 2021, issued in corresponding Chinese Patent Application No. 201880026812.X.
Extended European Search Report issued in corresponding EP Patent Application No. EP 18877791, dated May 29, 2020.

* cited by examiner

APPARATUS FOR ESTIMATING A BATTERY FREE CAPACITY

TECHNICAL FIELD

The present application claims priority to Korean Patent Application No. 10-2017-0153126 filed on Nov. 16, 2017 in the Republic of Korea, the disclosures of which are incorporated herein by reference.

The present disclosure relates to an apparatus for estimating a battery free capacity, and more particularly, an apparatus for estimating a free capacity of a half cell of a battery.

BACKGROUND ART

A secondary battery generates electrical energy through electrochemical oxidation and reduction reactions and is used for a wide variety of purposes. For example, the secondary battery is used for more fields, including handheld devices such as a cellular phone, a laptop computer, a digital camera, a video camera, a tablet computer and a power tool; various electric-driven power devices such as an electric bicycle, an electric motorcycle, an electric vehicle, a hybrid electric vehicle, an electric boat and an electric plane; energy storage systems used to store power generated by renewable energy or surplus generated power; and uninterruptible power supply systems for stably supplying power to various information communication devices such as a server computer and a communication base station.

The secondary battery includes three basic components, namely a negative electrode (an anode) containing a material that is oxidized while discharging electrons during discharge, a positive electrode (a cathode) containing a material that is reduced while accepting electrons during discharge, and an electrolyte that enables ion transfer between the negative electrode and the positive electrode. The secondary battery may be classified into a primary battery that is not able to be reused after being discharged, and a secondary battery in which the electrochemical reaction is at least partially reversible to allow repeated charging and discharging.

As the secondary battery, there are known lead-acid batteries, nickel-cadmium batteries, nickel-zinc batteries, nickel-iron batteries, silver oxide batteries, nickel metal hydride batteries, zinc-manganese oxide batteries, zinc-bromide batteries, metal-air batteries, lithium secondary batteries, and the like. Among them, the lithium secondary batteries have attracted the greatest commercial interest due to high energy density, high battery voltage and long life cycle, compared to other secondary batteries.

Meanwhile, an electronic device to which the secondary battery is applied generally has a function of informing a residual capacity through the state of charge (SOC) of the secondary battery. The SOC of the secondary battery is usually obtained from SOC-voltage data representing the variation pattern of SOC according to the change of voltage of the secondary battery. Here, the voltage of the secondary battery may be an open circuit voltage (OCV) of the secondary battery.

This SOC-voltage data is changed depending on the type or capacity of the corresponding secondary battery and also changed depending on the degradation due to use even if the type or capacity of the secondary battery is specified.

More specifically, the SOC-voltage data is changed depending on the degradation degree of each of the positive electrode and the negative electrode of the secondary battery, the capacity design, and the type of active material.

Accordingly, accurate SOC-voltage data of the positive electrode and the negative electrode of the secondary battery are required in order to accurately estimate the SOC-voltage data of the secondary battery.

Conventionally, in order to estimate the SOC-voltage data of the positive electrode and the negative electrode of the secondary battery, a reference electrode is physically inserted between the positive electrode and the negative electrode to measure the voltage of each of the positive electrode and the negative electrode, and the SOC-voltage data is estimated using the voltage.

However, if the secondary battery is provided in various devices as described above, it is impossible to physically insert the reference electrode between the positive electrode and the negative electrode to measure the voltage of each of the positive electrode and the negative electrode and then estimate the SOC-voltage data by using the voltage.

DISCLOSURE

Technical Problem

The present disclosure is directed to providing an apparatus for estimating a battery free capacity, which may accurately estimate a free capacity of a half cell without inserting a reference electrode by revising an entire SOC region of a half cell by using an inflection point detected based on SOC-voltage data of a full cell and a half cell of the battery, respectively, and then estimating the free capacity based on a SOC difference between the entire SOC regions before and after the revision.

The objects of the present disclosure are not limited to the above, and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

In one aspect of the present disclosure, there is provided an apparatus for estimating a battery free capacity, comprising: a sensing unit configured to measure a voltage of a battery; and a processor operably coupled to the sensing unit.

Preferably, the processor may be configured to detect a first inflection point of first SOC-voltage data based on the first SOC-voltage data of the battery in which a first SOC of the battery and the voltage of the battery are mapped, select a second inflection point satisfying an attribution electrode condition among second inflection points detected from second SOC-voltage data of a half cell for each of a positive electrode and a negative electrode of the battery, and estimate a free capacity of the half cell corresponding to the selected second inflection point by using a SOC ratio of a first SOC difference value between first SOCs corresponding to the first inflection point and a second SOC difference value between second SOCs of the half cell corresponding to the selected second inflection point.

Preferably, the processor may be configured to set first SOC region based on the first SOC corresponding to the first inflection point and determine whether the second inflection point satisfies the attribution electrode condition depending on whether the second SOC corresponding to the detected second inflection point is included in the first SOC region.

Preferably, the processor may be configured to determine that the second inflection point satisfies the attribution electrode condition when the second SOC corresponding to the detected second inflection point is included in the first SOC region, and determine that the second inflection point does not satisfy the attribution electrode condition when the second SOC corresponding to the detected second inflection point is not included in the first SOC region.

Preferably, the processor may be configured to increase or decrease the second SOC corresponding to the selected second inflection point by using the SOC ratio so that the second SOC is revised to a first revised SOC.

Preferably, the processor may be configured to increase or decrease a first entire SOC region of the half cell corresponding the selected second inflection point by using the SOC ratio so that the first entire SOC region is revised to a first revised entire SOC region. Preferably, the processor may be configured to revise the first revised entire SOC region to a second revised entire SOC region by using a third SOC difference value between the first SOC corresponding to the first inflection point and the first revised SOC.

Preferably, the processor may be configured to calculate a fourth SOC difference value between minimum SOCs of the first entire SOC region and the second revised entire SOC region, and estimate the fourth SOC difference value as a first free capacity of the half cell corresponding to the selected second inflection point.

Preferably, the processor may be configured to calculate a fifth SOC difference value between maximum SOCs of the first entire SOC region and the second revised entire SOC region, and estimate the fifth SOC difference value as a second free capacity of the half cell corresponding to the selected second inflection point.

In another aspect of the present disclosure, there is also provided a battery management system, comprising the apparatus for estimating a battery free capacity.

In another aspect of the present disclosure, there is also provided a vehicle, comprising the apparatus for estimating a battery free capacity.

In another aspect of the present disclosure, there is also provided an energy storage system, comprising the apparatus for estimating a battery free capacity.

Advantageous Effects

According to the present disclosure, it is possible to accurately estimate a free capacity of a half cell without inserting a reference electrode by revising an entire SOC region of a half cell by using an inflection point detected based on SOC-voltage data of a full cell and a half cell of the battery, respectively, and then estimating SOC-voltage data based on a SOC difference between the entire SOC regions before and after the revision.

BRIEF DESCRIPTION OF THE DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

MODE FOR CARRYING OUT THE INVENTION

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise. Furthermore, the term "control unit described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Figure 1:
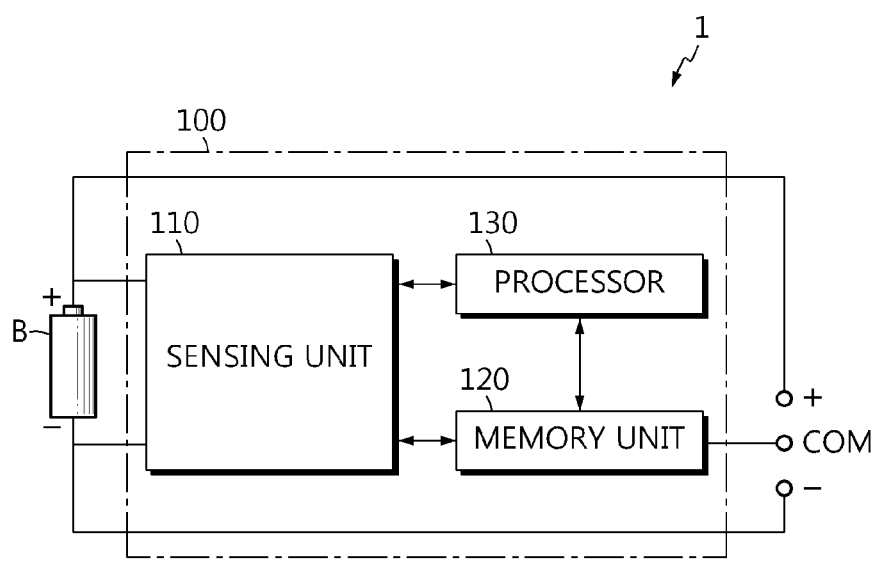
FIG. 1 is a diagram showing an apparatus for estimating a battery free capacity according to an embodiment of the present disclosure.
Figure 2:
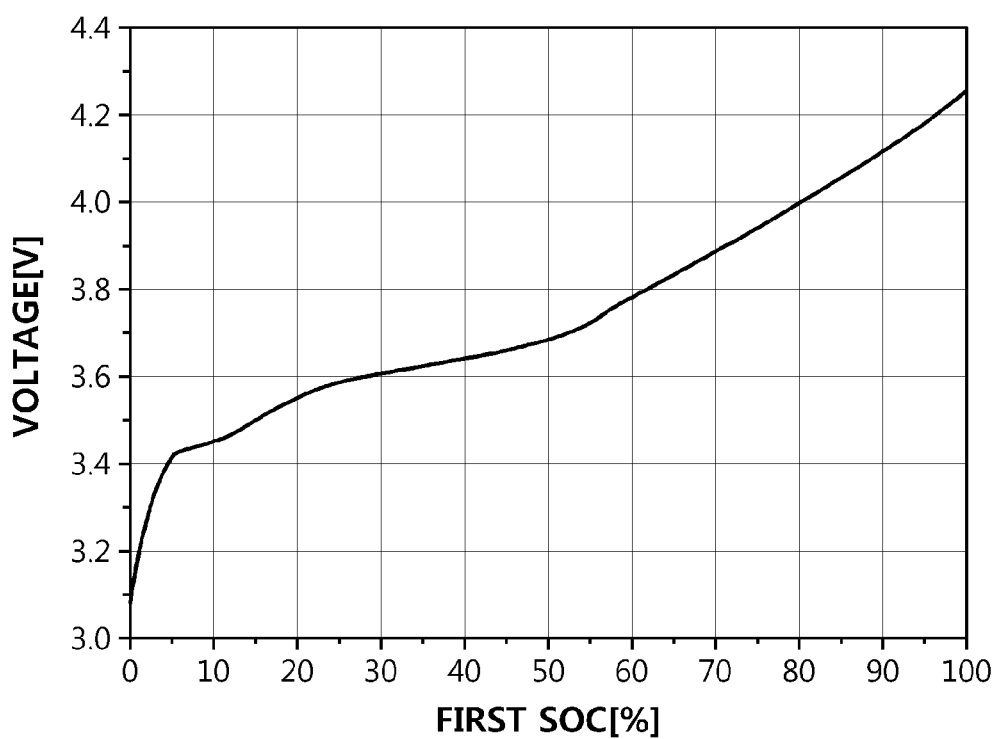
FIG. 2 is a graph showing a voltage of a battery according to a first SOC of a full cell of the battery.
Figure 3:
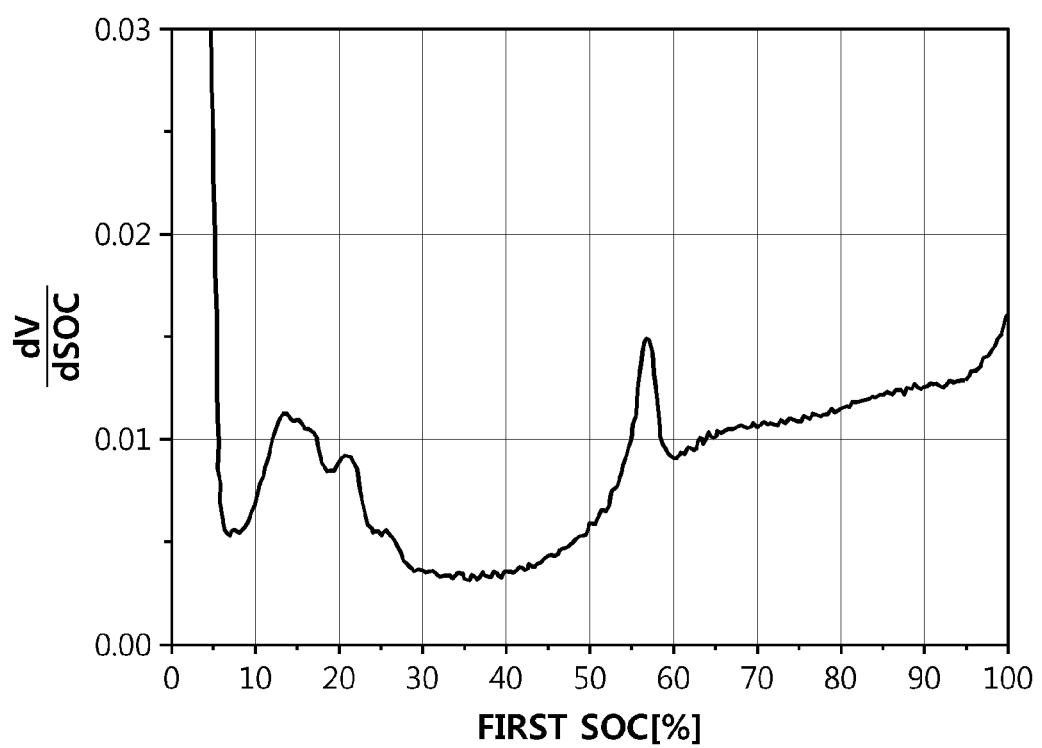
FIGS. 3 and 4 are voltage differential graphs of a battery according to the first SOC of the full cell of the battery before and after smoothing.
Figure 4:
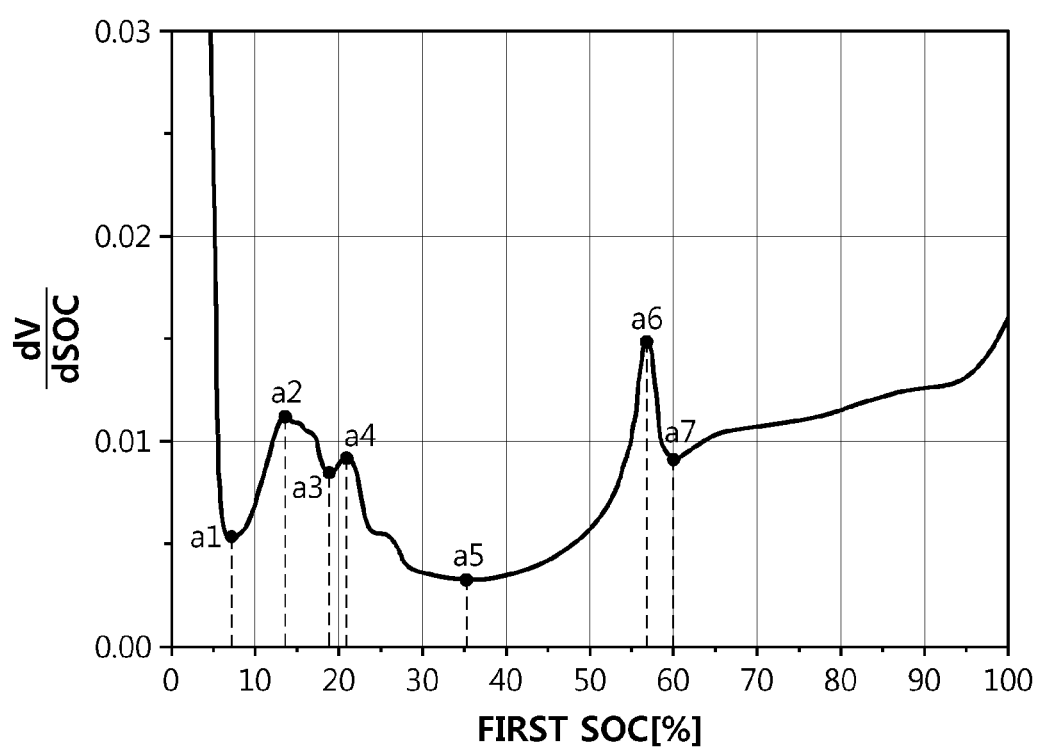
Figure 5:
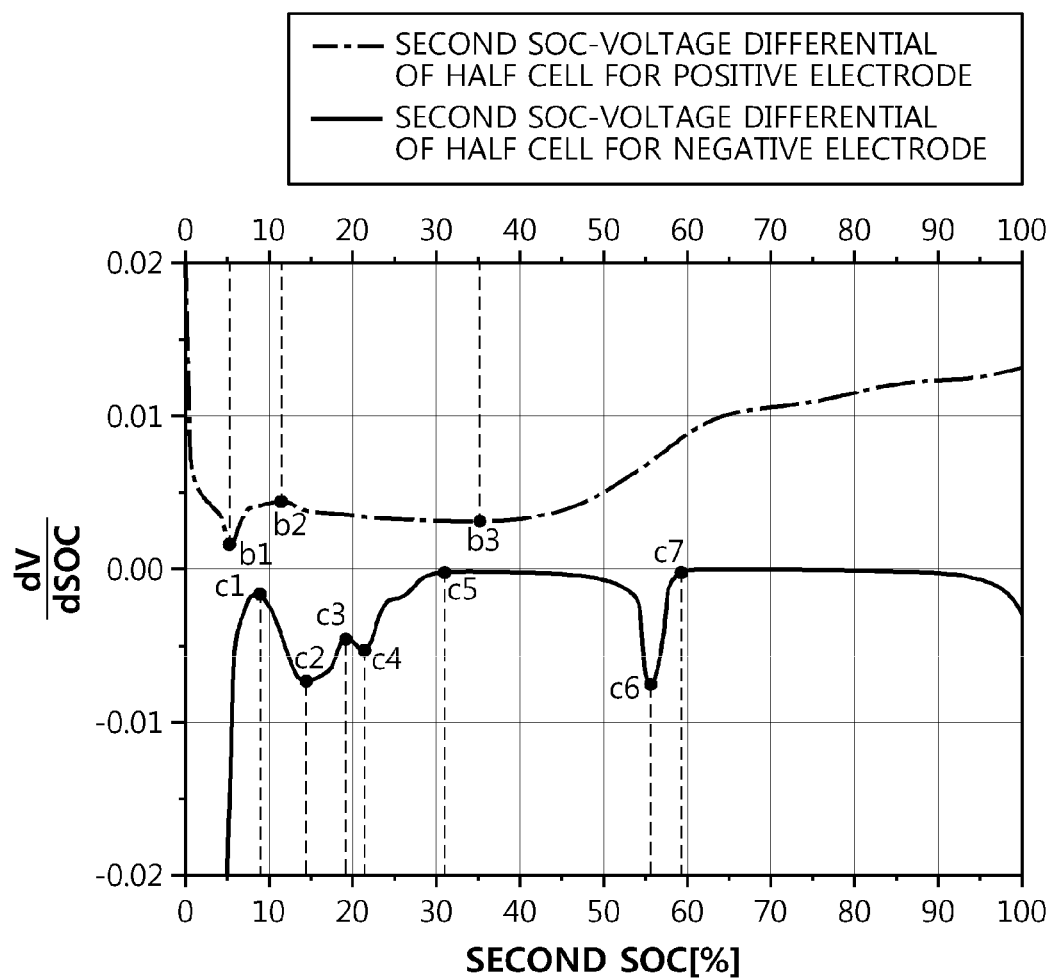
FIG. 5 is a voltage differential graph of a battery according to a second SOC of a half cell of the battery.
Figure 6:
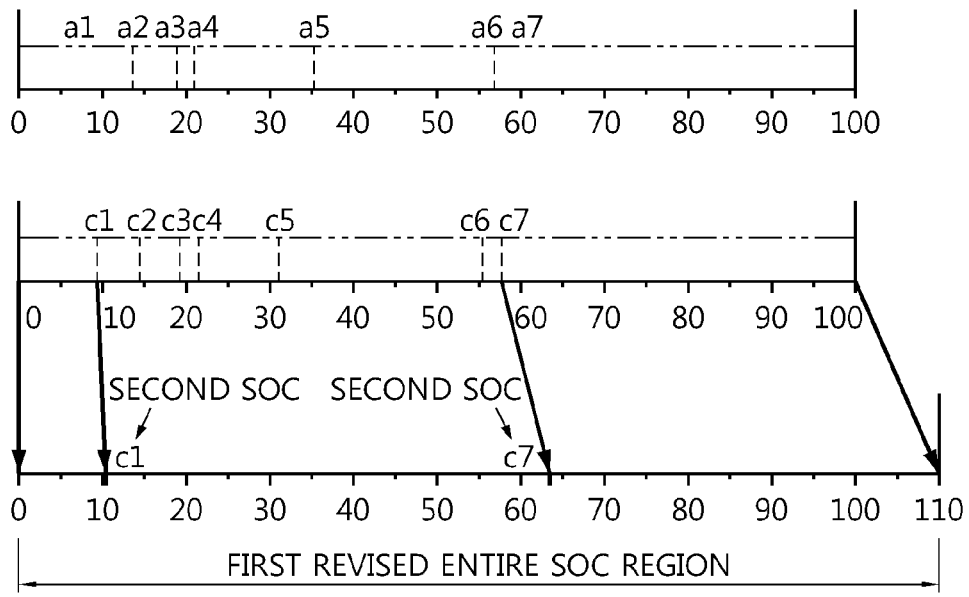
FIGS. 6 and 7 are graphs for illustrating a process of revising the second SOC of the half cell of the battery and a revised entire SOC region.
Figure 7:
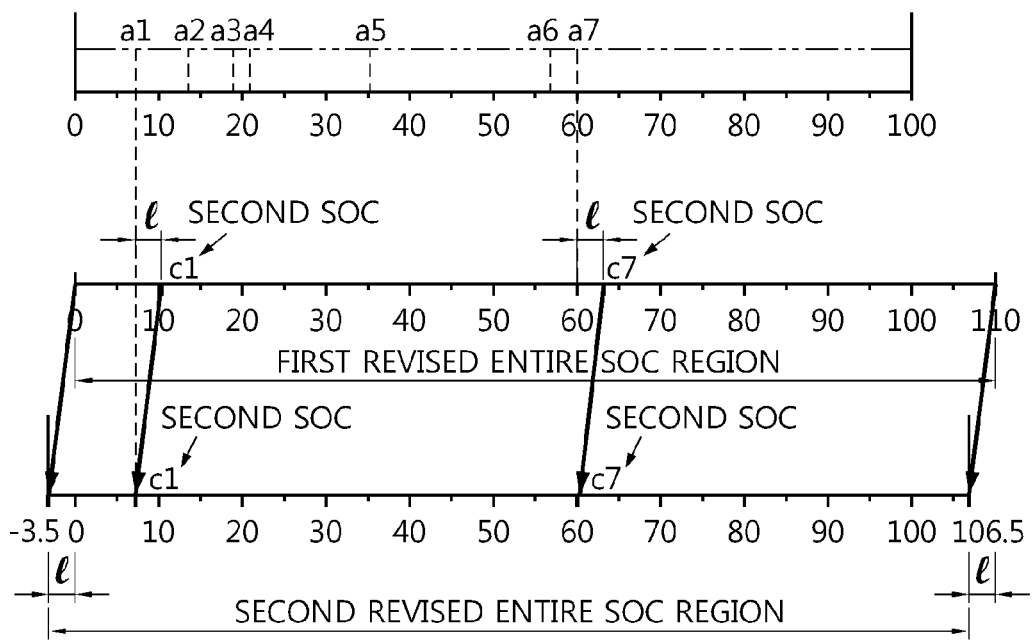

FIG. 1 is a diagram showing an apparatus for estimating a battery free capacity according to an embodiment of the present disclosure, FIG. 2 is a graph showing a voltage of a battery according to a first SOC of a full cell of the battery, FIGS. 3 and 4 are voltage differential graphs of a battery according to the first SOC of the full cell of the battery before and after smoothing, FIG. 5 is a voltage differential graph of a battery according to a second SOC of a half cell of the battery, and FIGS. 6 and 7 are graphs for illustrating a process of revising the second SOC of the half cell of the battery and a revised entire SOC region.

First, referring to FIG. 1, an apparatus 100 for estimating a battery free capacity according to an embodiment of the present disclosure may be included in a battery pack 1 having a battery B and be connected to the battery B to estimate a free capacity of a half cell of the battery B.

Meanwhile, the apparatus 100 for estimating a battery free capacity according to an embodiment of the present disclosure may also be included in a battery management system (BMS) provided at the battery pack 1.

The apparatus 100 for estimating a battery free capacity may include a sensing unit 110, a memory unit 120, and a processor 130.

The battery B is a battery of a minimum unit whose SOC is estimated and includes a plurality of unit cells electrically connected in series and/or in parallel. Here, the case where the battery B includes only one unit cell is also included in the scope of the present disclosure.

The unit cell is not specially limited on its type as long as it is capable of being repeatedly charged and discharged. For example, the unit cell may be a pouch-type lithium polymer battery.

The battery B may be electrically coupled to various external devices through an external terminal. For example, the external device may be an electric vehicle, a hybrid electric vehicle, an unmanned aerial vehicle such as a drone, a large capacity energy storage system (ESS) included in the power grid, or a mobile device. In this case, the battery B may include some or all of unit cells included in a modulated battery pack mounted to the external device.

The external terminal of the battery B may be selectively coupled to a charging device. The charging device may be selectively coupled to the battery B by control of the external device to which battery B is mounted.

The sensing unit 110 is operably coupled to the processor 130. That is, the sensing unit 110 may be connected to the processor 130 to transmit an electric signal to the processor 130 or to receive an electric signal from the processor 130.

The sensing unit 110 may repeatedly measure the voltage applied between a positive electrode and a negative electrode of the battery B and the current flowing into or out of the battery B at every preset cycle and provide a measurement signal indicating the measured voltage and current to the processor 130.

The sensing unit 110 includes a current sensor configured to measure a current of the battery B. Further, the sensing unit 110 may further include a voltage sensor configured to measure a voltage of the battery B.

If the measurement signal is received from the sensing unit 110, the processor 130 may determine digital values of the voltage and the current of the battery B by signal processing, respectively, and store the digital values in the memory unit 120.

The memory unit 120 is a semiconductor memory element that records, erases and updates data generated by the processor 130, and stores a plurality of program codes prepared for estimating a free capacity of a half cell of the battery B. In addition, the memory unit 120 may store preset values of various predetermined parameters used in implementing the present disclosure.

The memory unit 120 is not specially limited on its type as long as it is a semiconductor memory element known to be capable of writing, erasing and updating data. As an example, the memory unit 120 may be a DRAM, an SDRAM, a flash memory, a ROM, an EEPROM, a register, or the like. The memory unit 120 may further include a storage medium that stores program codes defining the control logic of the processor 130. The storage medium includes a non-volatile storage element such as a flash memory or a hard disk. The memory unit 120 may be physically separated from the processor 130 or may be integrated with the processor 130.

The processor 130 may control the current of the battery B so that the current of a preset charging current value is input to the battery B to charge the battery B, and estimate a first state of charge (SOC) of the battery B based on the current input to the battery B.

At this time, the preset charging current value may be calculated by using Equation 1 below.

$$I_c = a \times C_n \qquad \text{<Equation 1>}$$

Here, $I_c$ represents a preset charging current value, 'a' represents a constant of 1 or below, and $C_n$ represents a rated current of the battery.

Accordingly, the processor 130 may estimate the first SOC of the battery B to which the current of a charging current value smaller than the current value of the rated current is charged.

Meanwhile, if the battery B is a full cell, the first SOC of the battery B may be a ratio of a charging capacity of the full cell to the entire capacity of the full cell.

The processor 130 may estimate the first SOC of the battery B by using a current integration method that integrates a current value of the current input to the battery B.

Though it is described that the processor 130 estimates the first SOC of the battery B by using the current integration method, the estimating method is not specially limited as long as the first SOC of the battery B to which the current of a preset charging current value is input is estimated.

Meanwhile, the processor 130 may generate first SOC-voltage data of the battery B by mapping the voltage of the battery B with each estimated first SOC of the battery B.

Here, the voltage of battery B may be an open circuit voltage (OCV) of the battery B.

As shown in FIG. 2, the first SOC-voltage data of the battery B may be represented as a voltage curve of the battery B according to the first SOC of the battery B.

At this time, the memory unit 120 stores data in at least one form selected from an approximation function at which the first SOC-voltage data of the battery B is approximated to a voltage curve of the battery B according to the first SOC of the battery B and a lookup table at which the voltage of the battery B is mapped to each first SOC of the battery B.

The processor 130 may detect a first inflection point of the first SOC-voltage data based on the first SOC-voltage data of the battery B.

More specifically, the processor 130 may detect the first SOC and the voltage of the battery B at a point where change of the voltage of the battery B increases and then decreases according to a minute change of the first SOC based on the first SOC-voltage data as the first inflection point.

In addition, the processor 130 may detect the first SOC and the voltage of the battery B at a point where change of the voltage of the battery B decreases and then increases according to a minute change of the first SOC based on the first SOC-voltage data as the first inflection point.

That is, the processor 130 may detect the first SOC at which a second-order differential coefficient of the approximation function corresponding to the first SOC-voltage data of the battery B is "0" and the voltage of the battery B corresponding to the first SOC as the first inflection point.

To this end, as shown in FIG. 3, the processor 130 may calculate a first-order derivative by differentiating the approximation function corresponding to the first SOC-voltage data of the battery B.

After that, as shown in FIG. 4, the processor 130 may remove noise components by smoothing the first-order derivative of the approximation function corresponding to the first SOC-voltage data of the battery B.

At this time, the processor 130 may smooth the first-order derivative of the approximation function corresponding to the first SOC-voltage data of the battery B by using a noise filter.

By doing so, the processor 130 may improve the detection accuracy of the first inflection point by preventing the first inflection point from being erroneously detected due to noise components.

Next, the processor 130 may calculates a second-order derivative by differentiating the first-order derivative of the smoothed approximation function, and calculate a first SOC at which a calculated function value of the second-order derivative is "0" and a voltage of the battery B corresponding to the first SOC as the first inflection point.

For example, as shown in FIG. 4, the processor 130 may detect seven first inflection points a1, . . . , a7, and the first SOC corresponding to the seven first inflection points a1, . . . , a7 may be "7.2%", "13.6%", "19.1%", "21.2%", "35.3%", "56.8%" and "60.0%", respectively.

Meanwhile, the processor 130 may select a second inflection point satisfying an attribution electrode condition among second inflection points detected based on second SOC-voltage data of the half cell for each of the positive electrode and the negative electrode of the battery B.

Here, the second SOC-voltage data of the half cell for each of the positive electrode and the negative electrode of the battery B may be data obtained through a three-electrode experiment by using the battery B in a beginning of life (BOL) state without degradation.

Also, the second SOC-voltage data of the half cell for each of the positive electrode and the negative electrode of the battery B may be data at which the voltage of the half cell is mapped with each second SOC of the half cell.

Meanwhile, the second inflection point may be detected in advance based on the second SOC-voltage data of the half cell for each of the positive electrode and the negative electrode of the battery B, in the same method as the detection method of the first inflection point described above.

More specifically, the approximation function corresponding to the second SOC-voltage data of the half cell for each of the positive electrode and the negative electrode may be differentiated to calculate a first-order derivative, and the calculated first-order derivative may be smoothed through the noise filter. After that, the smoothed first-order derivative may be differentiated to calculate a second-order derivative. Finally, the second SOC at which a function value of the calculated second-order derivative is "0" and a voltage of the half cell corresponding to the second SOC may be detected as the second inflection point.

As shown in FIG. 5, three second inflection points b1, . . . , b3 may be detected based on the second SOC-voltage data of the half cell for the positive electrode, and the second SOC corresponding to three second inflection points b1, . . . , b3 may be "5.1%", "12.1%" and "36.3%", respectively.

In addition, seven second inflection points c1, . . . , c7 may be detected based on the second SOC-voltage data of the half cell for the negative electrode, and the second SOC corresponding to the seven second inflection points c1, . . . , c7 may be "9.7%", "14.8%", "19.1%", "21.2%", "32.8%", "54.3%" and "57.5%", respectively.

The data of the second inflection point detected in advance may be stored in the memory unit 120 in advance. That is, the memory unit 120 may store the data of the second inflection point detected based on the second SOC-voltage data of the half cell for the positive electrode and the data of the second inflection point detected based on the second SOC-voltage data of the half cell for the negative electrode in advance, respectively.

The processor 130 may read the detected second inflection point from the memory unit 120 to determine whether or not the attribution electrode condition is satisfied. First, the processor 130 may set a first SOC region based on the first SOC corresponding to the detected first inflection point.

For example, the processor 130 may set the first SOC region as SOC "5%" range from center values which are the first SOCs corresponding to the detected first inflection points a1, . . . , a7.

The processor 130 may set the first SOC region as a SOC "5%" range from the center values which are each of the first SOCs "7.2%", "13.6%", "19.1%", "21.2%", "35.3%", "56.8%" and "60.0%" corresponding to the first inflection points a1, . . . , a7. Accordingly, the processor 130 may set the first SOC region as "4.7% to 9.7%", "11.1% to 16.1%", "16.6% to 21.6%", "18.7% to 23.7%", "32.8% to 37.8%", "54.3% to 59.3%" and "57.5% to 62.5%", respectively.

After that, the processor 130 may determine whether the second inflection point satisfies the attribution electrode condition depending on whether the second SOC corresponding to the second inflection point stored in the memory unit 120 is included in the first SOC region.

More specifically, if the second SOC corresponding to the second inflection point is included in the first SOC region, the processor 130 may determine that the second inflection point satisfies the attribution electrode condition. On the contrary, if the second SOC corresponding to the second inflection point is not included in the first SOC region, the processor 130 may determine that the second inflection point does not satisfy the attribution electrode condition.

For example, the second SOC "5.1%", "12.1%" and "36.3%" corresponding to the second inflection points b1, . . . , b3 detected from the second SOC-voltage data of the half cell for the positive electrode are respectively included in the first SOC regions "4.7% to 9.7%", "11.1% to 16.1%" and "32.8% to 37.8%". Accordingly, the processor 130 may determine that all of the second inflection points b1, . . . , b3 detected based on the second SOC-voltage data of the half cell for the positive electrode satisfy the attribution electrode condition.

In addition, the second SOCs "9.7%", "14.8%", "19.1%", "21.2%", "32.8%", "54.3%" and "57.5%" corresponding to the second inflection points c1, . . . , c7 detected from the second SOC-voltage data of the half cell for the negative electrode are respectively included in the first SOC regions "4.7% to 9.7%", "11.1% to 16.1%", "16.6% to 21.6%", "18.7% to 23.7%", "32.8% to 37.8%", "54.3% to 59.3%" and "57.5% to 62.5%". Accordingly, the processor 130 may determine that all of the second inflection points c1, . . . , c7 detected based on the second SOC-voltage data of the half cell for the negative electrode satisfy the attribution electrode condition.

At this time, the processor 130 may select a half cell having a larger number of second inflection points satisfying the attribution electrode condition.

For example, since seven second inflection points c1, . . . , c7 detected from the second SOC-voltage data of the half cell for the negative electrode satisfy the attribution electrode condition and three second inflection points b1, . . . , b3 detected from the second SOC-voltage data of the half cell for the positive electrode satisfy the attribution electrode condition, the processor 130 may select the second inflection points c1, . . . , c7 detected from the second SOC-voltage data of the half cell for the negative electrode.

By doing so, the processor 130 may determine whether the voltage variation characteristic of the battery B according to the first SOC of the battery B is a variation characteristic attributed to any one of the positive electrode and the negative electrode.

As in the above example, if the second inflection point detected from the second SOC-voltage data of the half cell for the negative electrode is selected, the processor 130 may determine that the voltage variation characteristic of the battery B according to the first SOC of the battery B is a variation characteristic attributed to the negative electrode.

After that, the processor 130 may estimate a free capacity of the half cell corresponding to the selected second inflection point by using a SOC ratio of a first SOC difference value between the first SOCs corresponding to the first inflection point and a second SOC difference value between the second SOCs of the half cell corresponding to the selected second inflection point.

More specifically, the processor 130 may calculate a first SOC difference value between the minimum SOC and the maximum SOC among the first SOCs corresponding to the first inflection point and calculate a second SOC difference value between the minimum SOC and the maximum SOC among the second SOCs corresponding to the selected second inflection point.

After that, the processor 130 may calculate a SOC ratio of the calculated first SOC difference value and the calculated second SOC difference value.

More specifically, the processor 130 may calculate the ratio of the first SOC difference value to the second SOC difference value as the SOC ratio.

At this time, the processor 130 may calculate the SOC ratio using Equation 2 below.

$$R_{SOC} = \frac{SOC_{FC-MAX} - SOC_{FC-MIN}}{SOC_{HC-MAX} - SOC_{HC-MIN}} \quad \langle \text{Equation 2} \rangle$$

Here, $R_{SOC}$ represents a SOC ratio, $SOC_{FC-MAX}$ represents a maximum SOC among the first SOCs corresponding to the first inflection point, $SOC_{FC-MIN}$ represents a minimum SOC among the first SOCs corresponding to the first inflection point, $SOC_{HC-MAX}$ represents a maximum SOC among the second SOCs corresponding to the second inflection point, and $SOC_{HC-MIN}$ represents a minimum SOC among the second SOCs corresponding to the second inflection point.

In the above example, the processor 130 may calculate the first SOC difference value "52.8%" between the minimum SOC "7.2%" and the maximum SOC "60.0%" among the first SOCs "7.2%", "13.6%", "19.1%", "21.2%", "35.3%", "56.8%" and "60.0%" corresponding to the detected first inflection points a1, . . . , a7.

In addition, the processor 130 may calculate the second SOC difference value "47.8%" between the minimum SOC "9.7%" and the maximum SOC "57.5%" among the second SOCs "9.7%", "14.8%", "19.1%", "21.2%", "32.8%", "54.3%" and "57.5%" corresponding to the selected second inflection points c1, . . . , c7.

After that, the processor 130 may calculate the SOC ratio "1.1" between the first SOC difference value "52.8%" and the second SOC difference value "47.8%".

Meanwhile, the processor 130 may increase or decrease the second SOC corresponding to the selected second inflection point by using the SOC ratio so that the second SOC is revised to a first revised SOC.

At this time, the processor 130 may revise the second SOC corresponding to the selected second inflection point using the Equation 3 to the first revised SOC.

$$SOC_{HC-MAX}' = SOC_{HC-MAX} \times R_{SOC}$$

$$SOC_{HC-MIN}' = SOC_{HC-MIN} \times R_{SOC} \quad \langle \text{Equation 3} \rangle$$

Here, $SOC_{HC-MAX}'$ represents a maximum SOC among the first revised SOCs, $SOC_{HC-MIN}'$ represents a minimum SOC among the first revised SOCs, $SOC_{HC-MAX}$ represents a maximum SOC among the second SOCs corresponding to the second inflection point, $SOC_{HC-MIN}$ represents a minimum SOC among the second SOCs corresponding to the second inflection point, and $R_{SOC}$ represents a SOC ratio.

Then, the processor 130 may increase or decrease the first entire SOC region of the half cell corresponding to the selected second inflection point by using the SOC ratio so that the first entire SOC region is revised to a first revised entire SOC region.

At this time, the processor 130 may revise the first entire SOC region of the half cell corresponding to the selected second inflection point using Equation 4 to the first revised entire SOC region.

$$Rag_{HC-MAX}' = Rag_{HC-MAX} \times R_{SOC}$$

$$Rag_{HC-MIN}' = Rag_{HC-MIN} \times R_{SOC} \quad \langle \text{Equation 4} \rangle$$

Here, $Rag_{HC-MAX}'$ and $Rag_{HC-MIN}'$ respectively represent a maximum SOC and a minimum SOC of the first revised entire SOC region, $Rag_{HC-MAX}$ and $Rag_{HC-MIN}$ respectively represent a maximum SOC and a minimum SOC of the first entire SOC region of the half cell corresponding to the second inflection point, and $R_{SOC}$ represents a SOC ratio.

In the above example, as shown in FIG. 6, the processor 130 may revise the minimum SOC "9.7%" and the maximum SOC "57.5%" among the second SOCs "9.7%", "14.8%", "19.1%", "21.2%", "32.8%", "54.3%" and "57.5%" corresponding to the selected second inflection points c1, . . . , c7 to the first revised SOCs "10.7%" and "63.5%", respectively, by multiplying the SOC ratio "1.1" thereto.

The processor 130 may revise the first entire SOC region "0% to 100%" to the first entire SOC region "0% to 110%" by multiplying the SOC ratio "1.1" thereto.

After that, the processor 130 may revise the first revised entire SOC region to a second revised entire SOC region by using a third SOC difference value between the first SOC corresponding to the first inflection point and the first revised SOC.

More specifically, the processor 130 may calculate a third SOC difference value between a minimum SOC among the first SOCs corresponding to the first inflection point and a minimum SOC among the first revised SOCs.

The processor 130 may revise the first revised entire SOC region to the second revised entire SOC region by increasing or decreasing the minimum SOC and the maximum SOC of the first revised entire SOC region by the calculated third SOC difference value.

At this time, the processor 130 may revise the first revised entire SOC region to the second revised entire SOC region using Equation 5 below.

$$Rag_{HC-MAX}'' = Rag_{HC-MAX}' - (SOC_{FC-MIN} - SOC_{HC-MIN}')$$

$$Rag_{HC-MIN}'' = Rag_{HC-MIN}' - (SOC_{FC-MIN} - SOC_{HC-MIN}') \quad \langle \text{Equation 5} \rangle$$

Here, $Rag_{HC-MAX}''$ and $Rag_{HC-MIN}''$ respectively represent a maximum SOC and a minimum SOC of the second revised entire SOC region, $Rag_{HC-MAX}'$ and $Rag_{HC-MIN}'$ respectively represent a maximum SOC and a minimum SOC of the first revised entire SOC region, $SOC_{HC\text{-}MIN}'$ represents a minimum SOC among the first revised SOCs, and $SOC_{FC\text{-}MIN}$ represents a minimum SOC among the first SOCs corresponding to the first inflection point.

In the above example, as shown in FIG. 7, the processor 130 may calculate a third SOC difference value "−3.5%" between the minimum SOC "7.2%" among the first SOCs "7.2%", "13.6%", "19.1%", "21.2%", "35.3%", "56.8%" and "60.0%" corresponding to the detected first inflection points a1, . . . , a7 and the minimum SOC "10.7%" among the first revised SOCs "10.7%" and "63.5%".

Next, the processor 130 may add the calculated third SOC difference value "−3.5%" to the minimum SOC "0%" and the maximum SOC "110%" of the first revised entire SOC region to be revised to the second revised entire SOC region.

Accordingly, the minimum SOC and the maximum SOC of the second revised entire SOC region may be revised to "−3.5%" and "106.5%", respectively.

The processor 130 may calculate a fourth SOC difference value between minimum SOCs of the first entire SOC region and the second revised entire SOC region, and estimate the fourth SOC difference value as a first free capacity of the half cell corresponding to the second inflection point.

Here, the first free capacity may be a discharge termination free capacity.

At this time, the processor 130 may estimate the first free capacity using Equation 6 below.

$$SOC1 = |Rag_{HC\text{-}MIN}'' - Rag_{FC\text{-}MIN}| \qquad \text{<Equation 6>}$$

Here, SOC1 represents a first free capacity, $Rag_{HC\text{-}MIN}''$ represents a minimum SOC of the second revised entire SOC region, and $Rag_{FC\text{-}MIN}$ represents a minimum SOC of the first entire SOC region.

In the above example, as shown in FIG. 7, the processor 130 may calculate the fourth SOC difference value between the minimum SOC "0%" of the first entire SOC region and the minimum SOC "−3.5%" of the second revised entire SOC region as "3.5%".

Next, the processor 130 may estimate the first free capacity of the half cell for the negative electrode, which corresponds to the selected second inflection points c1, . . . , c7, as the fourth SOC difference value "3.5%".

Meanwhile, the processor 130 may calculate a fifth SOC difference value between the maximum SOCs of the first entire SOC region and the second revised entire SOC region, and estimate the fifth SOC difference value as a second free capacity of the half cell corresponding to the selected second inflection point.

Here, the second free capacity may be a charge termination free capacity.

At this time, the processor 130 may estimate the second free capacity using Equation 7 below.

$$SOC2 = Rag_{HC\text{-}MAX}'' - Rag_{FC\text{-}MAX} \qquad \text{<Equation 7>}$$

Here, SOC2 represents a second free capacity, $Rag_{HC\text{-}MAX}''$ represents a maximum SOC of the second revised entire SOC region, and $Rag_{FC\text{-}MAX}$ represents a maximum SOC of the first entire SOC region.

In the above example, as shown in FIG. 7, the processor 130 may calculate the fifth SOC difference value between the maximum SOC "100%" of the first entire SOC region and the maximum SOC "106.5%" of the second revised entire SOC region as "6.5%".

Next, the processor 130 may estimate the second free capacity of the half cell for the negative electrode, which corresponds to the selected second inflection points c1, . . . , c7, as the calculated fifth SOC difference value "6.5%".

By doing so, the processor 130 may accurately estimate the free capacity of the half cell without a free capacity estimating method using a three-electrode experiment or a mathematical modeling.

The processor 130 may send a message indicating the estimated first free capacity and the estimated second free capacity to an external device through the communication terminal COM.

The processor 130 may selectively include an application-specific integrated circuit (ASIC), another chipset, a logic circuit, a register, a communication modem, and a data processing device. At least one of the various control logics executable by the processor 130 may be combined, and the combined control logic is written in a computer-readable code system and recorded on a computer-readable recording medium. The recording medium has no limitation as long as it can be accessed by the processor 130 included in a computer. As one example, the recording medium includes at least one selected from the group consisting of a ROM, a RAM, a register, a CD-ROM, a magnetic tape, a hard disk, a floppy disk and an optical data recording device. In addition, the code system may be modulated into a carrier signal and stored in a communication carrier at a specific time, and may be stored and executed in a distributed manner on computers connected through a network. Moreover, functional programs, code and segments for implementing the combined control logics may be easily inferred by programmers in the technical field to which the present disclosure belongs.

Meanwhile, a vehicle according to the present disclosure may include the apparatus for estimating a battery free capacity as described above. By doing so, it is possible to estimate a free capacity of a battery pack provided at the vehicle.

Meanwhile, an energy storage system according to the present disclosure may include the apparatus for estimating a battery free capacity as described above. By doing so, it is possible to estimate a free capacity of a battery pack provided at the energy storage system.

The embodiments of the present disclosure described above are not necessarily implemented by apparatuses and methods but may also be implemented through a program for realizing functions corresponding to the configuration of the present disclosure or a recording medium on which the program is recorded. Such implementation may be easily performed by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

What is claimed is:

1. An apparatus for estimating a battery free capacity, comprising:
   a sensing unit configured to measure a voltage of a battery; and
   a processor operably coupled to the sensing unit, the processor being configured to:
      detect at least one first inflection point of first state of charge (SOC)-voltage data based on the first SOC-voltage data of the battery in which a first SOC of a full cell of the battery and the voltage of the battery are mapped;
      select between at least one second inflection point satisfying an attribution electrode condition among second inflection points from second SOC-voltage data of a half cell for a positive electrode of the battery and at least one second inflection point satisfying the attribution electrode condition among second inflection points from second SOC-voltage data of a half cell for a negative electrode of the battery; and
      estimate a free capacity of the half cell for the positive or negative electrode corresponding to the at least one selected second inflection point using an SOC ratio of:
         a first SOC difference value between first SOC values corresponding to the at least one first inflection point; and
         a second SOC difference value between second SOC values of the half cell for the positive or negative electrode corresponding to the at least one selected second inflection point.

2. The apparatus for estimating a battery free capacity according to claim 1, wherein the processor is further configured to:
   set at least one first SOC region based on the first SOC values corresponding to the at least one first inflection point; and
   determine whether a second inflection point among the second inflection points from the second SOC-voltage data of the half cell for the positive electrode and of the half cell for the negative electrode satisfies the attribution electrode condition depending on whether a second SOC value corresponding to the second inflection point is included in the at least one first SOC region.

3. The apparatus for estimating a battery free capacity according to claim 2, wherein the processor is further configured to:
   determine that the second inflection point satisfies the attribution electrode condition if the second SOC value corresponding to the second inflection point is included in the at least one first SOC region; and
   determine that the second inflection point does not satisfy the attribution electrode condition if the second SOC value corresponding to the second inflection point is not included in the at least one first SOC region.

4. The apparatus for estimating a battery free capacity according to claim 1,
   wherein the processor is further configured to increase or decrease the second SOC values corresponding to the at least one selected second inflection point using the SOC ratio so that the second SOC values are revised to first revised SOC values.

5. The apparatus for estimating a battery free capacity according to claim 4, wherein the processor is further configured to increase or decrease a first entire SOC region of the half cell corresponding the at least one selected second inflection point using the SOC ratio so that the first entire SOC region is revised to a first revised entire SOC region.

6. The apparatus for estimating a battery free capacity according to claim 5, wherein the processor is further configured to revise the first revised entire SOC region to a second revised entire SOC region using a third SOC difference value between one of the first SOC values corresponding to the at least one first inflection point and one of the first revised SOC values.

7. The apparatus for estimating a battery free capacity according to claim 6, wherein the processor is further configured to:
   calculate a fourth SOC difference value between minimum SOC values of the first entire SOC region and the second revised entire SOC region; and
   estimate the fourth SOC difference value as a first free capacity of the half cell corresponding to one of the at least one selected second inflection point.

8. The apparatus for estimating a battery free capacity according to claim 6, wherein the processor is further configured to:
   calculate a fifth SOC difference value between maximum SOC values of the first entire SOC region and the second revised entire SOC region; and
   estimate the fifth SOC difference value as a second free capacity of the half cell corresponding to one of the at least one selected second inflection point.

9. The apparatus for estimating a battery free capacity according to claim 4, wherein the processor is further configured to:
   control a current of the battery so that a current of a preset charging current value is input to the battery to charge the battery; and
   determine the first SOC of the battery based on the current input to the battery.

10. The apparatus for estimating a battery free capacity according to claim 9, wherein the preset charging current value is smaller than a rated current of the battery.

11. A battery management system, comprising an apparatus for estimating a battery free capacity according to claim 1.

12. A vehicle, comprising an apparatus for estimating a battery free capacity according to claim 1.

13. An energy storage system, comprising an apparatus for estimating a battery free capacity according to claim 1.

14. The apparatus for estimating a battery free capacity according to claim 1, wherein the processor is further configured to:
   control a current of the battery so that a current of a preset charging current value is input to the battery to charge the battery; and
   determine the first SOC of the battery based on the current input to the battery.

15. The apparatus for estimating a battery free capacity according to claim 1, wherein the preset charging current value is smaller than a rated current of the battery.

* * * * *